(12) United States Patent
Park et al.

(10) Patent No.: US 10,394,095 B2
(45) Date of Patent: Aug. 27, 2019

(54) LIQUID CRYSTAL DISPLAY

(71) Applicant: Samsung Display Co., Ltd., Yongin-si, Gyeonggi-do (KR)

(72) Inventors: Eun-Kil Park, Cheonan-si (KR); Kyung-Ho Park, Asan-si (KR); Chang Il Tae, Seoul (KR); Jae Won Kim, Asan-si (KR); Yoo Mi Ra, Ansan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/053,774

(22) Filed: Feb. 25, 2016

(65) Prior Publication Data

US 2016/0291369 A1 Oct. 6, 2016

(30) Foreign Application Priority Data

Apr. 2, 2015 (KR) .................. 10-2015-0046934

(51) Int. Cl.
*G02F 1/1368* (2006.01)
*G02F 1/1362* (2006.01)
*G02F 1/1335* (2006.01)
G09G 3/36 (2006.01)
G02B 5/20 (2006.01)
G02F 1/1341 (2006.01)
(Continued)

(52) U.S. Cl.
CPC .. *G02F 1/136209* (2013.01); *G02F 1/133514* (2013.01); *C08L 2666/70* (2013.01); *G02B 5/201* (2013.01); *G02B 5/223* (2013.01); *G02F 1/13624* (2013.01); *G02F 1/133371* (2013.01); G02F 1/133707 (2013.01); G02F 2001/13415 (2013.01); G02F 2001/136222 (2013.01); G03F 7/0007 (2013.01); G09G 3/3607 (2013.01); G09G 3/3648 (2013.01); G09G 2300/0452 (2013.01)

(58) Field of Classification Search
CPC ... G02F 1/136209; G02F 2001/136222; G02F 1/133371; G02F 1/133707; G02F 1/13624
See application file for complete search history.

(56) References Cited

U.S. PATENT DOCUMENTS 7,209,201 B2  4/2007  Lin et al.
7,602,456 B2  10/2009  Tanaka et al.
(Continued)

FOREIGN PATENT DOCUMENTS

KR    10-0607519 B1    8/2006
KR    10-2007-0000635 A    1/2007
(Continued)

*Primary Examiner* — Hoan C Nguyen
(74) *Attorney, Agent, or Firm* — Innovation Counsel LLP

(57) ABSTRACT

A liquid crystal display according to an exemplary embodiment of the present inventive concept includes a first substrate including a plurality of first color filters, a plurality of second color filters, a plurality of third color filters and a plurality of gate electrodes extending in a first direction; a second substrate facing the first substrate; and a liquid crystal layer formed between the first substrate and the second substrate, wherein the plurality of first color filters include a plurality of first portions extending in a first direction, and a plurality of second portions extending in a second direction substantially perpendicular to the first direction and crossing the plurality of first portions.

9 Claims, 12 Drawing Sheets

(51) Int. Cl.
  *G03F 7/00* (2006.01)
  *G02B 5/22* (2006.01)
  *G02F 1/1333* (2006.01)
  *G02F 1/1337* (2006.01)

(56) References Cited

U.S. PATENT DOCUMENTS

| | | | |
|---|---|---|---|
| 9,075,279 B2* | 7/2015 | Son | G02F 1/136204 |
| 9,201,254 B2* | 12/2015 | Park | G02F 1/1313 |
| 9,274,390 B2* | 3/2016 | Chang | G02F 1/136209 |
| 2001/0012079 A1* | 8/2001 | Yamamoto | G02F 1/133514 |
| | | | 349/106 |
| 2002/0089624 A1* | 7/2002 | Matsumoto | G02F 1/133512 |
| | | | 349/106 |
| 2005/0270445 A1* | 12/2005 | Lee | G02F 1/133514 |
| | | | 349/108 |
| 2009/0153785 A1* | 6/2009 | Iwato | G02F 1/13394 |
| | | | 349/106 |
| 2009/0167996 A1* | 7/2009 | Takahashi | G02F 1/133512 |
| | | | 349/106 |
| 2011/0233552 A1* | 9/2011 | Kawamura | G02F 1/136209 |
| | | | 257/59 |
| 2013/0100390 A1 | 4/2013 | Wang | |
| 2013/0286315 A1 | 10/2013 | Yanagisawa | |
| 2014/0036380 A1 | 2/2014 | Tung et al. | |

FOREIGN PATENT DOCUMENTS

| | | |
|---|---|---|
| KR | 10-2008-0034545 A | 4/2008 |
| KR | 10-2010-0061124 A | 6/2010 |
| KR | 10-1036723 B1 | 5/2011 |

* cited by examiner

LIQUID CRYSTAL DISPLAY

CROSS-REFERENCE TO RELATED APPLICATION

This application claims priority to and the benefit of Korean Patent Application No. 10-2015-0046934 filed in the Korean Intellectual Property Office on Apr. 2, 2015, the entire contents of which are incorporated herein by reference.

BACKGROUND (a) Field

The present inventive concept relates to a liquid crystal display.

(b) Description of the Related Art

A liquid crystal display (LCD) is one of the most widely used flat panel displays (FPD), and it comprises two display panels on which field generating electrodes such as a pixel electrode and a common electrode are formed, and a liquid crystal layer interposed between the two display panels. A voltage is applied between the field generating electrodes to generate an electric field on the liquid crystal layer, and the orientation of liquid crystal molecules of the liquid crystal layer is determined and the polarization of incident light is controlled through the generated electric field to display an image.

Among liquid crystal displays, a liquid crystal display in a vertically aligned mode in which major axes of the liquid crystal molecules are aligned to be perpendicular to the upper and lower display panels when no electric field is applied to the liquid crystal layer has received much attention because it has a high contrast ratio and a wide reference viewing angle.

In order to implement a wide viewing angle in the vertical alignment mode liquid crystal display, a plurality of domains having different alignment directions of the liquid crystal may be formed in one pixel.

As described above, as a means of forming the plurality of domains, a method of forming cutouts such as minute slits in the field generating electrode or protrusions on the field generating electrode is used. The method enables the plurality of domains to be created by aligning the liquid crystal molecules in a direction perpendicular to a fringe field that is generated between edges of the cutouts or protrusions and the field generating electrodes facing the edges thereof.

On the other hand, by forming a light blocking member at a position in which the thin film transistor is formed, a leakage current of the channel layer according to the light is prevented. However, when an optical density of the light blocking member is low, although the light blocking member is formed, light leakage may be partially generated.

Also, to prevent transmission deterioration depending on an alignment error between two display panels, when forming the color filter in the thin film transistor array panel like the light blocking member, a design limitation for the formation position of the contact hole occurs as a result of the step generated due to the overlap of the color filters.

The above information disclosed in this Background section is only to enhance the understanding of the background of the inventive concept, and therefore it may contain information that does not form the prior art that is already known in this country to a person of ordinary skill in the art.

SUMMARY

The present inventive concept provides a liquid crystal display that solves the problems of light leakage from the channel layer and the design limitation resulting from the step generated due to the overlap between the color filters.

A liquid crystal display according to an exemplary embodiment of the present inventive concept includes a first substrate including a plurality of first color filters, a plurality of second color filters, a plurality of third color filters and a plurality of gate electrodes extending in a first direction;
 a second substrate facing the first substrate; and
 a liquid crystal layer formed between the first substrate and the second substrate,
 wherein the plurality of first color filters include a plurality of first portions extending in a first direction, and a plurality of second portions extending in a second direction substantially perpendicular to the first direction and crossing the plurality of first portions.

The plurality of first portions may overlap the plurality of second color filters and the plurality of second color filters in a second direction.

The plurality of first portions and the plurality of second portions may form a plurality of openings, and the plurality of second color filters and the plurality of third color filters may be disposed in the plurality of openings.

The first color filter may be a blue color filter.

A red color filter and a green color filter may be formed in an opening of the plurality of openings.

A plurality of thin film transistors formed on the first substrate, the plurality of first portions may be formed to overlap the plurality of thin film transistors.

The plurality of first portions do not overlap the plurality of second color filters and the plurality of second color filters in a second direction.

The liquid crystal display may further include a light leakage preventing layer made of the same material as the plurality of gate electrodes and overlapping spaces formed between the plurality of first color filters and the plurality of second color filters, and spaces between the plurality of first color filters and the plurality of third color filters.

The plurality of first portions and the plurality of second portions may form a plurality of openings, and the plurality of first color filters and the plurality of second color filters may be disposed in the plurality of openings.

The first color filter is a blue color filter.

A liquid crystal display according to an exemplary embodiment of the present inventive concept includes a first substrate including a plurality of first color filters, a plurality of second color filters, and a plurality of third color filters; a second substrate facing the first substrate; a liquid crystal layer formed between the first substrate and the second substrate; a plurality of thin film transistors formed on the first substrate; and an opaque material formed on the plurality of thin film transistors to overlap the plurality of thin film transistors.

The plurality of first color filters may include a plurality of first portions extending in a first direction, and a plurality of second portions extending in a second direction substantially perpendicular to the first direction and crossing the plurality of first portions.

The plurality of first portions and the plurality of second portions may form a plurality of openings, and wherein the plurality of second color filters and the plurality of third color filters are disposed in the plurality of openings.

The plurality of first color filter is a blue color filter.

The opaque material may be formed of aluminum (Al) or copper (Cu).

The plurality of first portions do not overlap the plurality of second color filters and the plurality of third color filters in a second direction.

The opaque material may overlap spaces formed between the plurality of first color filter and the plurality of second color filters, and spaces formed between the plurality of first color filters and the plurality of third color filters.

The plurality of first color filters, the plurality of second color filters and the plurality of third color filters may extend in a second direction and overlap the plurality of thin film transistors.

According to the liquid crystal display of the present inventive concept, light leakage of the channel layer may be prevented, and the design limitation due to the overlapping step of the color filters may be overcome when forming the contact hole, the spacer etc.

DETAILED DESCRIPTION OF THE EMBODIMENTS

Figure 1:
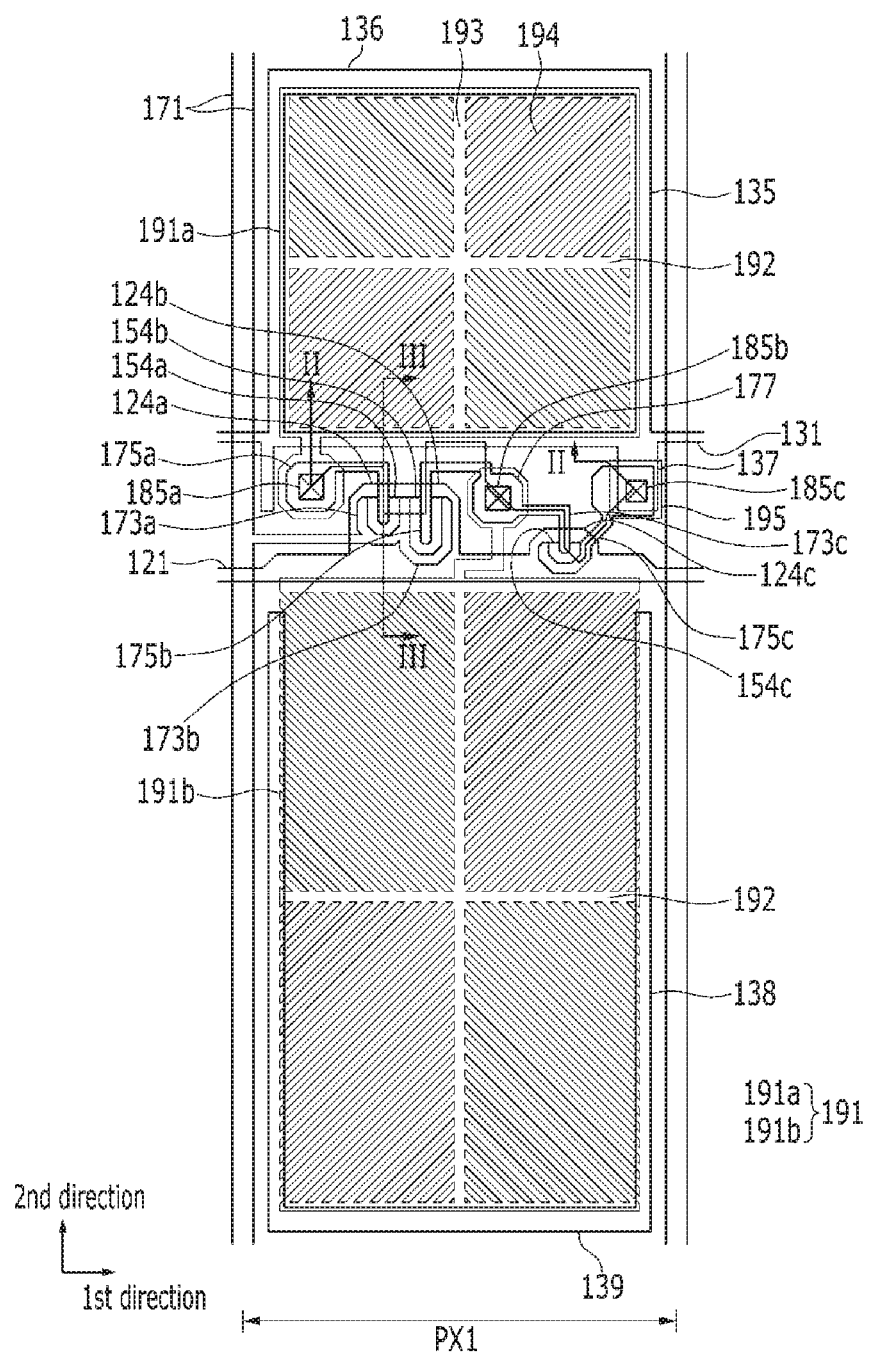
FIG. 1 is a schematic layout view of a pixel area in a liquid crystal display according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

The drawings and descriptions are to be regarded as illustrative in nature and not restrictive. Like reference numerals designate like elements throughout the specification.

In several exemplary embodiments, components having the same configuration will be described representatively in a first exemplary embodiment by using the same reference numerals thereafter. In exemplary embodiments other than the first exemplary embodiment, only configurations different from those of the first exemplary embodiment will be described.

In addition, sizes and thicknesses of the respective components shown in the drawings are arbitrarily drawn for convenience as the thicknesses are exaggerated in order to clearly express several layers and regions in the drawings, thus the present inventive concept is not necessarily limited to what is shown in the drawings.

In addition, in the case in which it is stated that a portion such as a layer, a film, a region, a plate, or the like is present "on", "over", or "below" another portion, the portion may be directly formed on another portion or have other intervening layers therebetween.

In addition, unless explicitly described to the contrary, the word "comprise" and variations such as "comprises" and "comprising", will be understood to imply the inclusion of stated elements, but not the exclusion of any other elements.

Now, a liquid crystal display according to an exemplary embodiment of the present inventive concept will be described with reference to FIG. 1 to FIG. 3.

Figure 2:
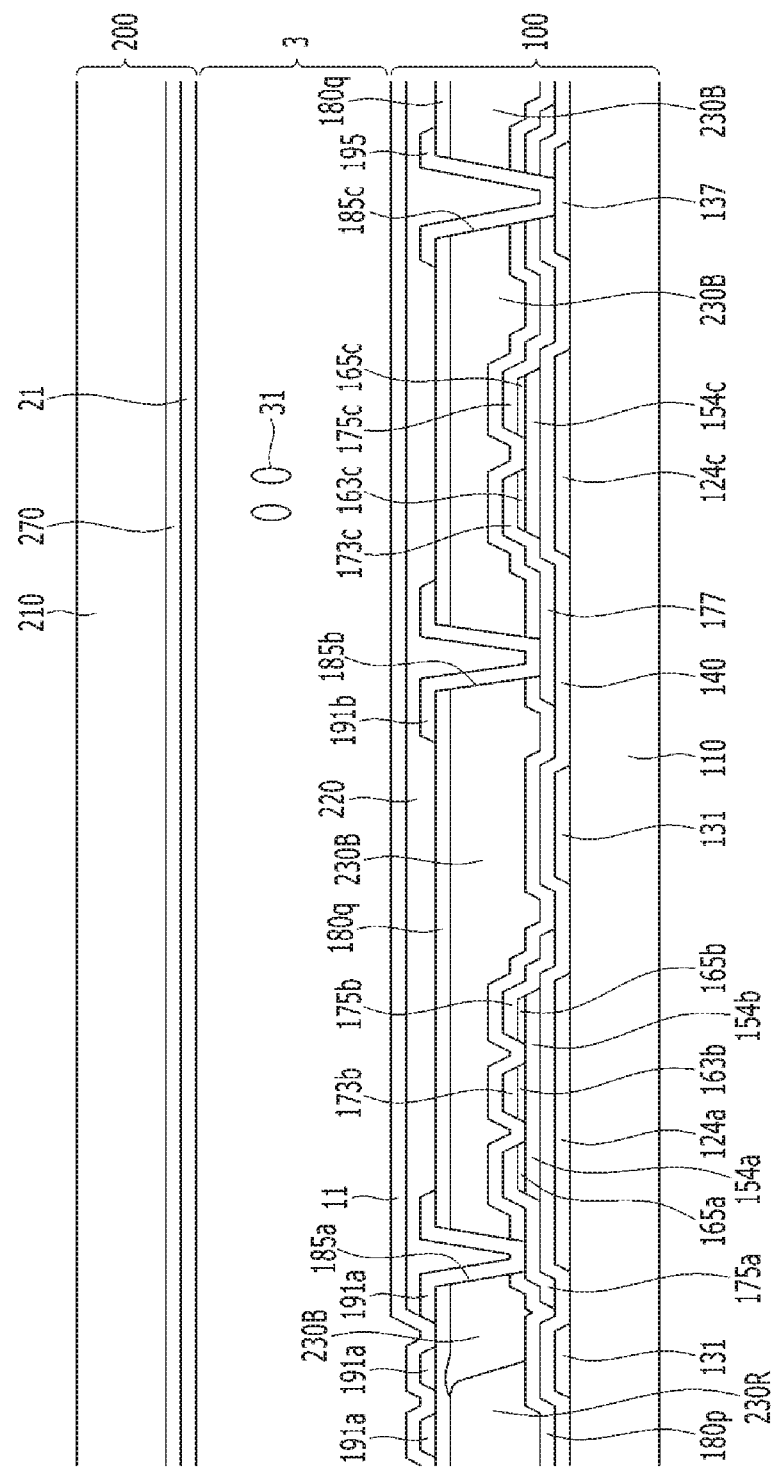
FIG. 2 is a cross-sectional view of the liquid crystal display of FIG. 1 taken along line II-II.

FIG. 1 is a schematic layout view of a pixel area in a liquid crystal display according to an exemplary embodiment of the present inventive concept, and FIG. 2 is a cross-sectional view of the liquid crystal display of FIG. 1 taken along line II-II. FIG. 3 is a cross-sectional view of the liquid crystal display of FIG. 1 taken along line III-III.

Figure 3:
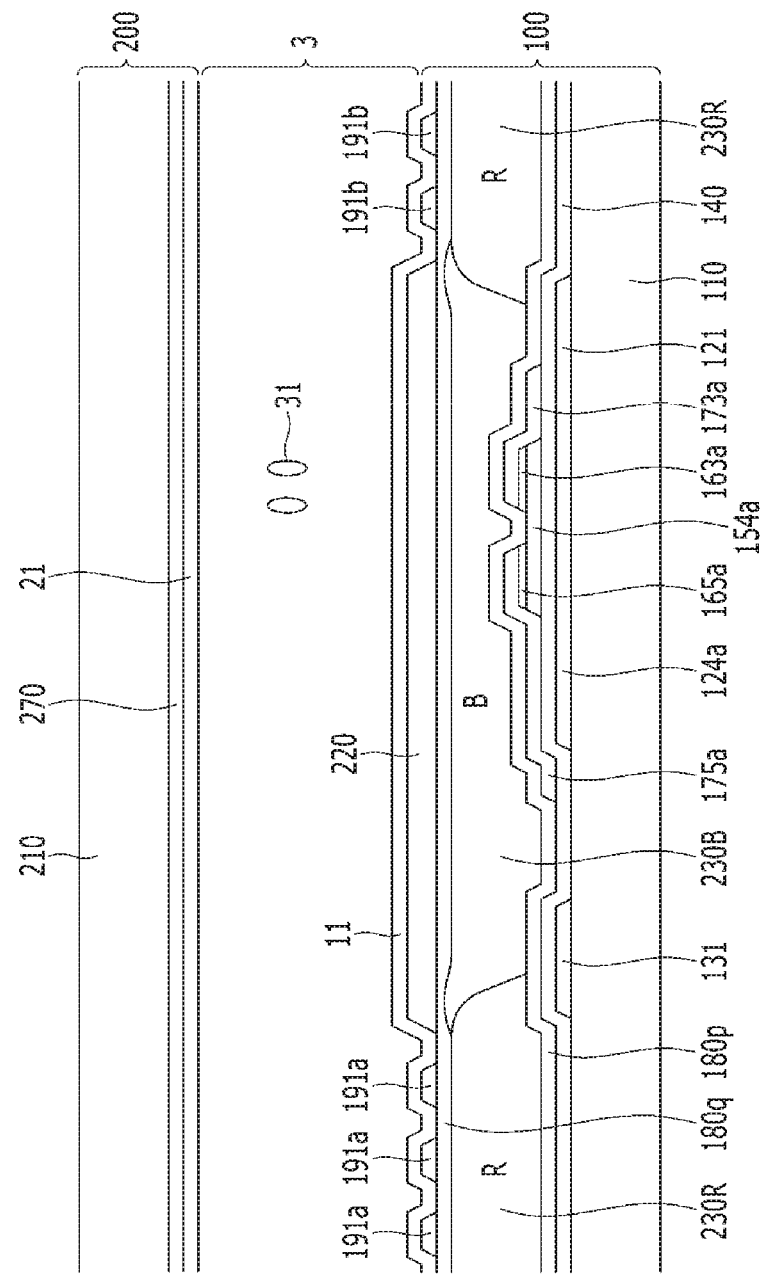
FIG. 3 is a cross-sectional view of the liquid crystal display of FIG. 1 taken along line III-III.

First, referring to FIG. 1 to FIG. 3, a liquid crystal display according to the present exemplary embodiment includes a thin film transistor array panel 100 and an opposing panel 200 facing each other, a liquid crystal layer 3 interposed between the two display panels 100 and 200, and a pair of polarizers (not shown) attached at the outer surfaces of the display panels 100 and 200.

First, the thin film transistor array panel 100 will be described.

A gate line 121 and a storage electrode line 131, which is parallel to the gate line 121, are formed in one direction on a first substrate 110 of the thin film transistor array panel 100.

The gate line 121 mainly extends in a horizontal direction and transfers a gate signal. In addition, the gate line 121 is provided with a first gate electrode 124a and a second gate electrode 124b that protrude from the gate line 121. Furthermore, the gate line 121 is provided with a third gate electrode 124c that protrudes from the gate line and is formed so as to be spaced apart from the first gate electrode 124a and the second gate electrode 124b. The first to third gate electrodes 124a, 124b, and 124c are connected to the same gate line 121 and are applied with the same gate signal.

The storage electrode line 131 extends in the same direction as the gate line 121 and is applied with a predetermined voltage. Also, first storage electrodes 135 and 136 and a reference electrode 137 protruding from the storage electrode line 131 are included. The first storage electrodes 135 and 136 may be formed to enclose a first pixel electrode 191a that will be described later.

Second storage electrodes 138 and 139 that are not connected to the storage electrode line 131 and overlap the second pixel electrode 191b are disposed to surround a second pixel electrode 191b.

A gate insulating layer 140 is formed on the gate line 121, the first to third gate electrodes 124a, 124b, and 124c, the storage electrode line 131, the first storage electrodes 135 and 136, and the second storage electrode 138 and 139. The gate insulating layer 140 may be made of an inorganic insulating material such as silicon nitride (SiNx) and silicon oxide (SiOx). Also, the gate insulating layer 140 may be made of a single layer or multiple layers.

A first semiconductor layer 154*a*, a second semiconductor layer 154*b*, and a third semiconductor layer 154*c* are formed on the gate insulating layer 140. The first semiconductor layer 154*a* may be disposed on the first gate electrode 124*a*, the second semiconductor layer 154*b* may be disposed on the second gate electrode 124*b*, and the third semiconductor layer 154*c* may be disposed on the third gate electrode 124*c*.

A plurality of ohmic contacts 163*a*, 165*a*, 163*b*, 165*b*, 163*c*, and 165*c* is formed on the semiconductor layers 154*a*, 154*b*, and 154*c*.

A data conductor including a plurality of data lines 171 including a first source electrode 173*a* and a second source electrode 173*b*, a first drain electrode 175*a*, a second drain electrode 175*b*, a third source electrode 173*c*, and a third drain electrode 175*c* is formed on the ohmic contacts 163*a*, 165*a*, 163*b*, 165*b*, 163*c*, and 165*c*, and the gate insulating layer 140.

The data conductor and the underlying semiconductor layer and the ohmic contacts may be simultaneously formed by one mask.

The first to third semiconductors 154*a*, 154*b*, and 154*c* may be formed on the first to third gate electrodes 124*a*, 124*b*, and 124*c*, and may also be formed below the data line 171.

The data line 171 transfers a data signal and is mainly extended in a vertical direction so as to intersect the gate line 121.

The first source electrode 173*a* is formed so as to protrude from the data line 171 over the first gate electrode 124*a*. The first source electrode 173*a* may have a curved C-shape on the first gate electrode 124*a*.

The first drain electrode 175*a* is formed on the first gate electrode 124*a* so as to be spaced apart from the first source electrode 173*a*. A channel is formed in the first semiconductor layer 154*a* in a portion exposed between the first source electrode 173*a* and the first drain electrode 175*a* that are formed so as to be spaced apart from each other.

The second source electrode 173*b* is formed so as to protrude from the data line 171 over the second gate electrode 124*b*. The second source electrode 173*b* may have a curved C-shape on the second gate electrode 124*b*.

The second drain electrode 175*b* is formed on the second gate electrode 124*b* so as to be spaced apart from the second source electrode 173*b*. A channel is formed in the second semiconductor layer 154*b* in a portion exposed between the second source electrode 173*b* and the second drain electrode 175*b* that are formed so as to be spaced apart from each other.

The second drain electrode 175*b* is connected with the third source electrode 173*c*, and includes an extended portion 177 that is widely extended. The third drain electrode 175*c* is formed on the third gate electrode 124*c* so as to be spaced apart from the third source electrode 173*c*. A channel is formed in the third semiconductor layer 154*c* in a portion exposed between the third source electrode 173*c* and the third drain electrode 175*c* that are formed so as to be spaced apart from each other.

The first gate electrode 124*a*, the first source electrode 173*a*, and the first drain electrode 175*a* form a first thin film transistor (TFT) along with the island first semiconductor layer 154*a*, similarly, the second gate electrode 124*b*, the second source electrode 173*b*, and the second drain electrode 175*b* form a second thin film transistor along with the island second semiconductor layer 154*b*. The third gate electrode 124*c*, the third source electrode 173*c*, and the third drain electrode 175*c* form a third thin film transistor along with the island third semiconductor layer 154*c*.

A first passivation layer 180*p* is formed on the data conductors 171, 173*c*, 175*a*, 175*b*, and 175*c*, and the exposed portion of the semiconductors 154*a*, 154*b*, and 154*c*. The first passivation layer 180*p* may include an inorganic insulating layer such as silicon nitride or silicon oxide and may be formed of a signal layer or multiple layers. The first passivation layer 180*p* may prevent diffusion of a pigment of the color filters 230R, 230G, and 230B into the exposed portion of the semiconductor layers 154*a*, 154*b*, and 154*c*.

Figure 4:
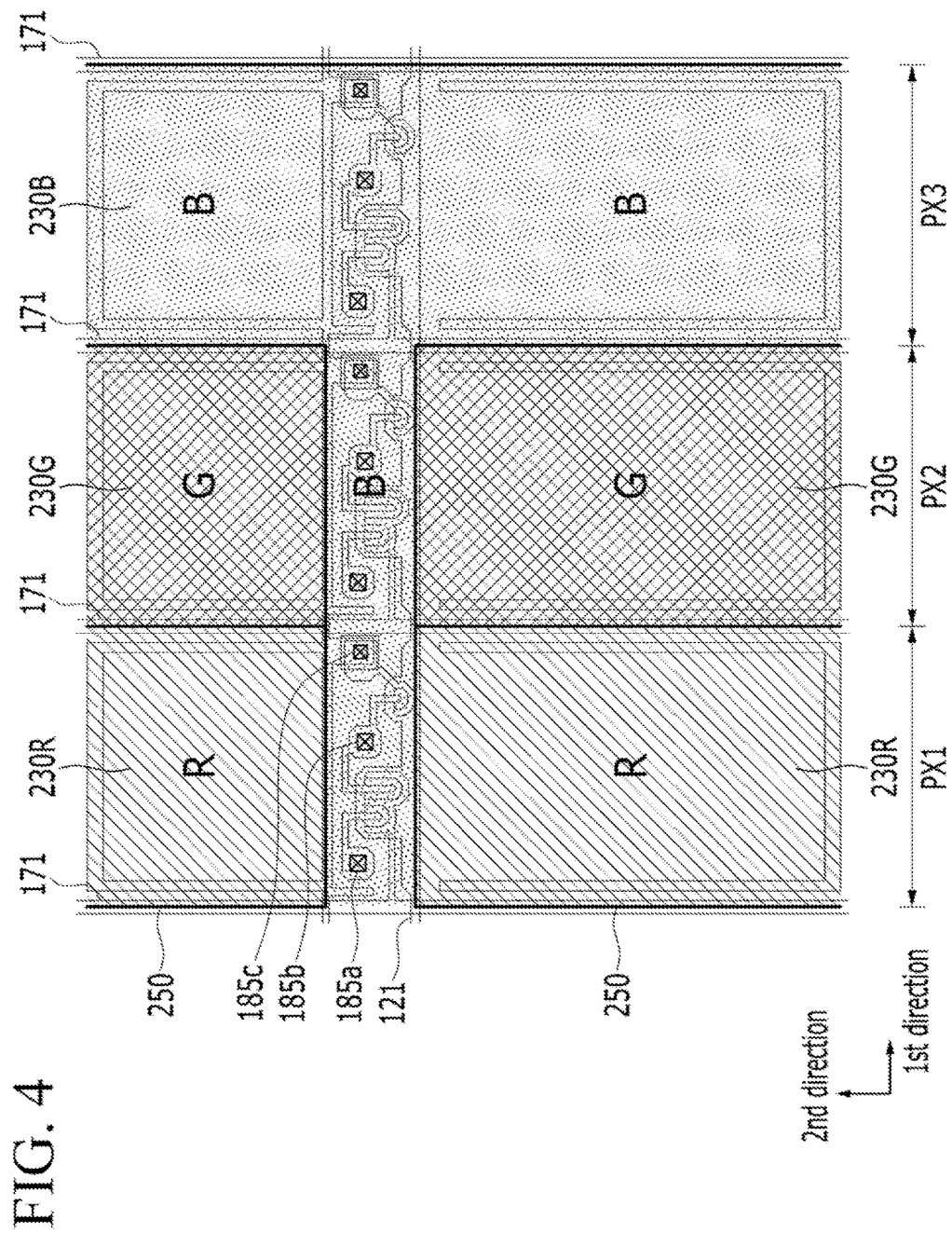
FIG. 4 is a top plan view showing a laminated state for color filters 230R, 230G, and 230B in three adjacent pixel areas in a liquid crystal display according to the exemplary embodiment of FIG. 1.
Figure 5:
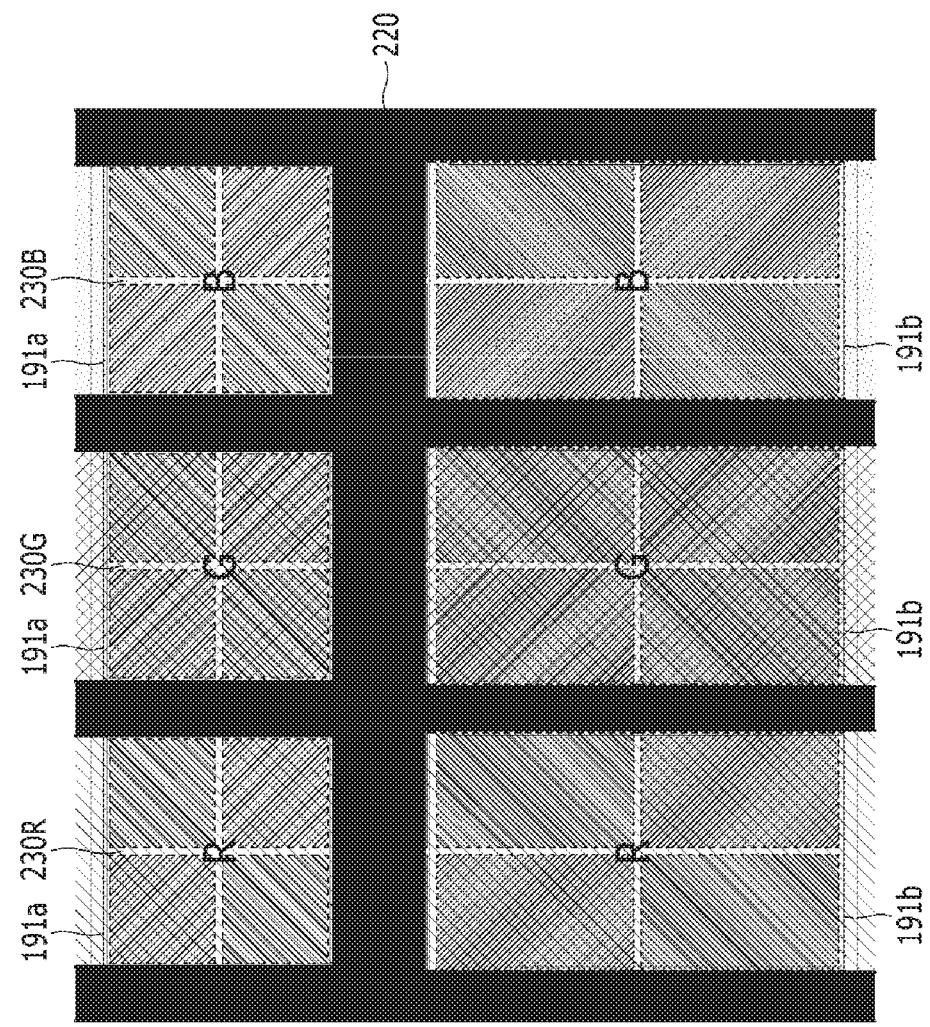
FIG. 5 is a top plan view showing a state of further depositing a pixel electrode 191 and a light blocking member 220 in three pixel areas of FIG. 4.

The deposition structure on the first passivation layer 180*p* will be described with reference to FIG. 3 to FIG. 5. FIG. 4 is a top plan view showing a laminated state of color filters 230R, 230G, and 230B in three adjacent pixel areas in a liquid crystal display according to the exemplary embodiment of FIG. 1, and FIG. 5 is a top plan view showing a state of further depositing a pixel electrode 191 and a light blocking member 220 in three pixel areas of FIG. 4.

The color filters 230R, 230G, and 230B are formed on the first passivation layer 180*p*. The first to third pixel areas PX1, PX2, and PX3 are areas formed between the two adjacent data lines 171 and the color filters 230R, 230G, and 230B are formed in the first to third areas respectively. That is, a red color filter 230R is formed in the first pixel area PX1, a green color filter 230G is formed in the second pixel area PX2, and a blue color filter 230B is formed in the third pixel area PX3.

However, the red color filter 230R may not be formed on the region between the first pixel electrode 191*a* and th
e second pixel electrode 191*b* are formed in the first pixel area PX1 in which the first to third thin film transistors are formed, and the green color filter 230G may also not be formed on the region between the first pixel electrode 191*a* and the second pixel electrode 191*b* are formed in the second pixel area PX2 in which the first to third thin film transistors are formed. That is, the red color filter 230R is divided into two regions by the first to third thin film transistors and the gate line 121 formed between the first pixel electrode 191*a* and the second pixel electrode 191*b* in the first pixel area PX1, and the green color filter 230G is divided into two regions by the first to third thin film transistors and the gate line 121 formed between the first pixel electrode 191*a* and the second pixel electrode 191*b* in the second pixel area PX2.

However, the blue color filter 230B is also formed in the region where the first to third thin film transistors of the first pixel area PX1 and the second pixel area PX2, as well as the third pixel area PX3, are formed. That is, the blue color filter 230B is formed in the third pixel area PX3 which extends along a first line and in an area which extends along a second line substantially perpendicular to the first direction in which the thin film transistor of the first to third pixel areas PX1, PX2, and PX3 is formed. The second line is formed to cover the first to third thin film transistors of the first to third pixel areas PX1, PX2, and PX3, and first to third contact holes 185 *a*, 185 *b*, and 185 *c*, which are described later, and the gate line 121. The second line extends in the same direction as the gate line 121, to be positioned to overlap at least a portion of two data lines 171 disposed at both sides of one pixel area. That is, the blue color filter 230B is formed of the first line and the second line, and the first line and the second line vertically cross to form an opening 250, thereby forming a shape where the first pixel area and the second pixel area are disposed in the opening 250. Also, the red color filter is formed in the first pixel area disposed at the opening 250, and the green color filter is formed in the second pixel area. In the present exemplary embodiment, the portion where the blue color filter 230B is formed in the third pixel area PX3 is referred to as the first line, however the blue color filter 230B of the first line may be formed in the first pixel area PX1 or the second pixel area PX2 according to an exemplary embodiment.

The blue color filter 230B has a low transmittance of light compared with the red color filter 230R or the green color filter 230G, such that the second line formed of the blue color filter 230B serves to effectively prevent light leakage from the region of the first to third thin film transistors and the gate line 121 in addition to a light blocking member 220, which will be described later. Also, since the second line is formed of one blue color filter 230B, it may prevent the step generated due to the overlapping of the different color filters 230R, 230G, and 230B in the region where the first to third thin film transistors are formed. Accordingly, by avoiding the step, the design limitation in which the contact hole, the spacer, etc., is disposed may be solved.

A second passivation layer 180q is formed on the first passivation layer 180p and the color filters 230R, 230G, and 230B. The second passivation layer 180q may include an inorganic insulating layer such as silicon nitride and silicon oxide. The upper passivation layer 180q prevents peeling of the color filters 230R, 230G, and 230B, and suppresses contamination of the liquid crystal layer 3 by the solvent that diffuses from the color filters 230R, 230G into the liquid crystal layer 3, and 230B, thereby preventing defects such as afterimages that may occur when an image is driven.

The first passivation layer 180p, the color filters 230R, 230G, and 230B, and the second passivation layer 180q have a first contact hole 185a and a second contact hole 185b respectively exposing a portion of the first drain electrode 175a and the second drain electrode 175b.

The gate insulating layer 140, the third drain electrode 175c, the first passivation layer 180p, the color filters 230R, 230G, and 230B, and the second passivation layer 180q have a third contact hole 185c exposing a portion of the reference electrode 137.

A first pixel electrode 191a and a second pixel electrode 191b are formed on the second passivation layer 180q.

The first pixel electrode 191a, the second pixel electrode 191b, and a connecting member 195 are formed on the second passivation layer 180q.

Referring to FIG. 1, each pixel electrode 191 includes the first pixel electrode 191a and the second pixel electrode 191b, which are separated from each other via the gate line 121 and are adjacent in the column direction with respect to the gate line 121. They have an overall quadrangular shape and include a cross-shaped stem portion including a horizontal stem portion 192 and a vertical stem portion 193 crossing the horizontal stem portion 192. The first pixel electrode 191a and the second pixel electrode 191b are divided into four sub-regions by the transverse stem 192 and the longitudinal stem 193, and each of the sub-regions includes a plurality of minute branches 194.

Some minute branches 194 of the first pixel electrode 191a and the second pixel electrode 191b obliquely extend in the upper left direction from the transverse stem 192 or the longitudinal stem 193, and other minute branches 194 obliquely extend in the upper right direction from the transverse stem 192 or the longitudinal stem 193. Further, some other minute branches 194 extend in the lower left direction from the transverse stem 192 or the longitudinal stem 193, and other minute branches 194 obliquely extend in the lower right direction from the transverse stem 192 or the longitudinal stem 193.

Each of the minute branches 194 forms an angle of about 40 degrees to 45 degrees with the gate line 121 or the transverse stem 192. Particularly, the minute branches 194 included in the first pixel electrode 191a may form an angle of about 40 degrees with the transverse stem 192, and the minute branches 194 included in the second pixel electrode 191b may form an angle of about 45 degrees with the transverse stem 192. Also, the minute branches 194 of two neighboring subregions may be crossed.

The area of the second pixel electrode 191b may be larger than that of the first pixel electrode 191a. The area of the second pixel electrode 191b may be less than two times of the area of the first pixel electrode 191a.

The pixel electrode 191 may be made of a transparent material such as ITO and IZO. The pixel electrode 191 may be made of a transparent conductive material such as ITO or IZO, or a reflective metal such as aluminum, silver, chromium, or an alloy thereof.

Referring to FIG. 2, the first pixel electrode 191a is physically and electrically connected to the first drain electrode 175a through the first contact hole 185a and the second pixel electrode 191b is physically and electrically connected to the second drain electrode 175b through the second contact hole 185b. The first pixel electrode 191a and the second pixel electrode 191b are applied with the data voltage from the first drain electrode 175a and the second drain electrode 175b. In this case, the portion of the data voltage applied to the second drain electrode 175b is divided through the third source electrode 173c such that the magnitude of the voltage applied to the second pixel electrode 191b is smaller than the magnitude of the voltage applied to the first pixel electrode 191a. This is a case in which the data voltage applied to the first pixel electrode 191a and the second pixel electrode 191b has a positive polarity (+). On the other hand, in the case the data voltage applied to the first pixel electrode 191a and the second pixel electrode 191b has a negative polarity (−), the voltage applied to the first pixel electrode 191a is smaller than the voltage applied to the second pixel electrode 191b.

The first and second pixel electrodes 191a and 191b applied with the data voltage generate the electric field along with the common electrode 270 of the opposing panel 200, which will be described later, such that the electric field determines the direction of the liquid crystal molecules in the liquid crystal layer 3 between two electrodes 191 and 270. Thus, the luminance of light passing through the liquid crystal layer is changed according to the direction of the liquid crystal molecules.

The connecting member 195 is formed with the same layer as the first pixel electrode 191a and the second pixel electrode 191b and covers the third contact hole 185c. The connecting member 195 electrically connects the reference electrode 137 and the third drain electrode 175c through the third contact hole 185c.

Again, referring to FIG. 3 to FIG. 5, a light blocking member 220 is formed on the second passivation layer 180q, the edge of the first pixel electrode 191a and the second pixel electrode 191b, and the data line 171. The light blocking member 220 extends along the data line 171 and is positioned between two adjacent color filters. The width of the light blocking member 220 may be wider than the width of the data line 171. Accordingly, by forming the width of the light blocking member 220 to be wider than the width of the data line 171, the light blocking member 220 may prevent incident light from the outside from being reflected in the surface of the data line 171 of the metal. Accordingly, interference between light reflected on the surface of the data line 171 and light passing through the liquid crystal layer 3 may be prevented to reduce deterioration of a contrast ratio of the liquid crystal display. Additionally, the light blocking member 220 is formed on the second line made of the blue color filter 230B such that light leakage may be prevented in the region where the gate line 121 and the first to third thin film transistors are formed.

A first alignment layer 11 is disposed on the pixel electrode 191 and the light blocking member 220. The first alignment layer 11 may be a vertical alignment layer.

The first alignment layer 11 may be formed to include at least one of the materials that are generally used as an alignment layer for liquid crystals, such as polyamic acid, polyimide, or the like. The first alignment layer 11 may include a reactive mesogen that forms a polymer by UV irradiation.

Next, the opposing display panel 200 will be described.

Although not shown, a common electrode 270 is formed on the second substrate 210. A second alignment layer 21 is formed on the common electrode 270, and the second alignment layer 21 may be the vertical alignment layer and may be the same material as the above described first alignment layer 11.

A sealant (not shown) is formed between the first substrate 110 and the second substrate 210. The liquid crystal layer 3 having the liquid crystal molecule 31 is injected into the space between the first substrate 110 and the second substrate 210 with. The long axes of the liquid crystal molecules 31 of the liquid crystal layer 3 are aligned to be perpendicular to the surfaces of the two display panels 100 and 200 when no electric field is applied.

The first and second pixel electrodes 191a and 191b and the common electrode 270 form a liquid crystal capacitor, so as to maintain the applied voltage even after the thin film transistor is turned off. In this case, sides of the minute branches 194 distort the electric field, thereby generating horizontal components, which are perpendicular to the sides of the minute branches 194, and inclined directions of the liquid crystal molecules are determined as directions determined by the horizontal components. Therefore, the liquid crystal molecules tend to be initially inclined in directions which are perpendicular to the sides of the minute branches 194 when electric field is applied to the liquid crystal molecules. However, since the directions of the horizontal components of the electric field by the neighboring sides of the minute branches 194 are opposite to each other and an interval between the minute branches 194 is narrow, the liquid crystal molecules which tend to be inclined in a direction opposite to each other are inclined together in a direction which is parallel to a length direction of the minute branches 194.

Since the minute branches 194 of one pixel extend in all four directions in an exemplary embodiment of the present inventive concept, the liquid crystal molecules 31 are also inclined in all four directions. As such, in the case in which the inclined directions of the liquid crystal molecules are variously implemented, a reference viewing angle of the liquid crystal display is increased.

Polarizers (not shown) may be provided on one side of the first substrate 110 and the second substrate 210, and the polarization axis of two polarizers may be parallel or crossing. In the case of the reflective liquid crystal display, one of the two polarizers may be omitted.

Next, another exemplary embodiment of the present inventive concept will be described with reference to FIG. 6 and FIG. 7 while focusing on the differences from the above exemplary embodiment. The shapes and the structure of the other constituent elements are the same as in the descriptions of FIG. 1 to FIG. 5, thus the duplicate description thereof is omitted.

Figure 6:
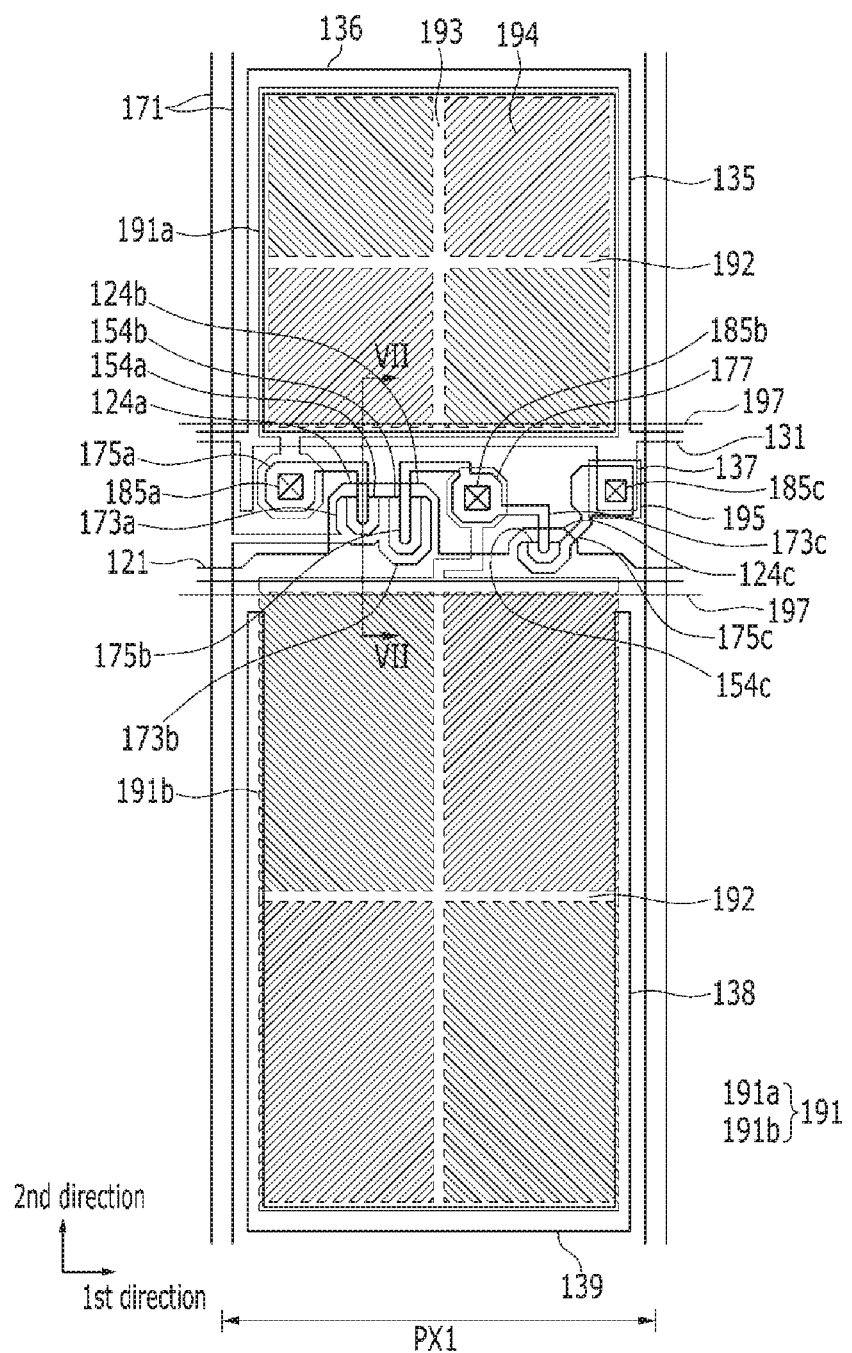
FIG. 6 is a schematic layout of a first pixel area PX1 in a liquid crystal display according to an exemplary embodiment of the present inventive concept.
Figure 7:
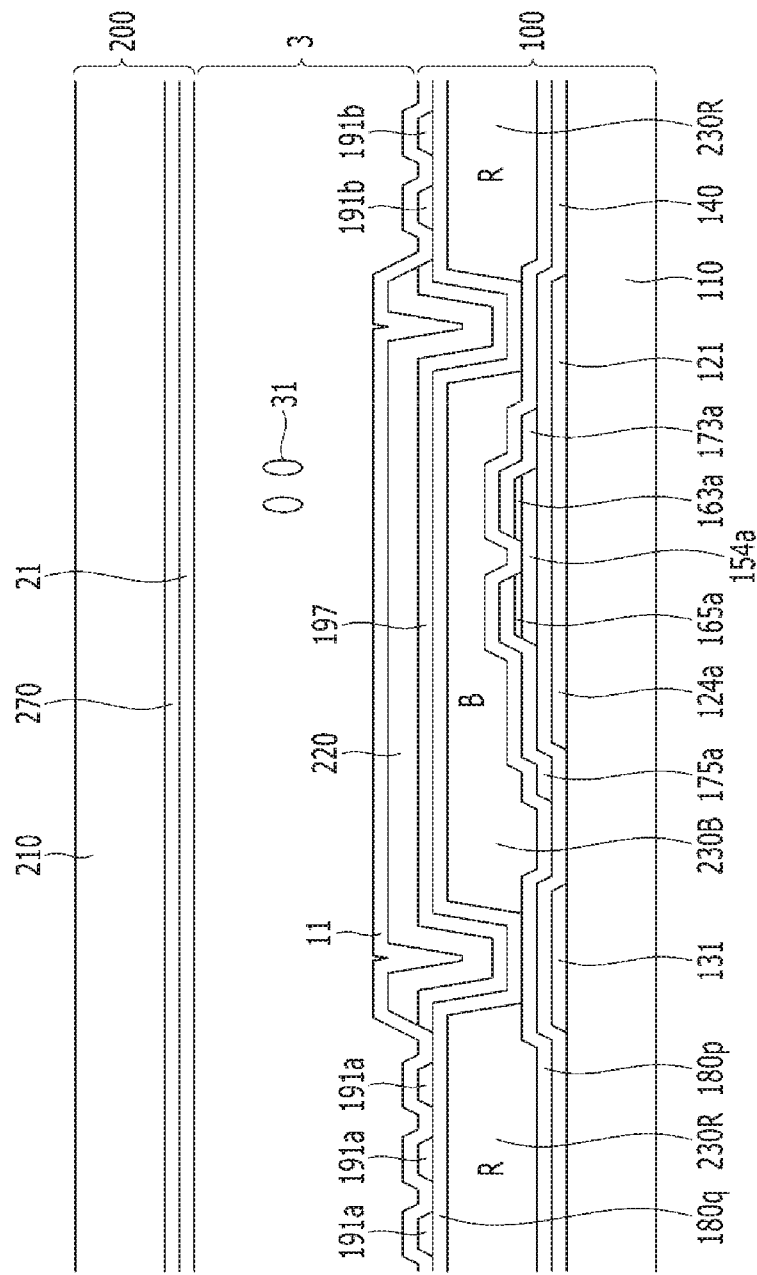
FIG. 7 is a cross-sectional view of the liquid crystal display of FIG. 6 taken along line VII-VII.
Figure 8:
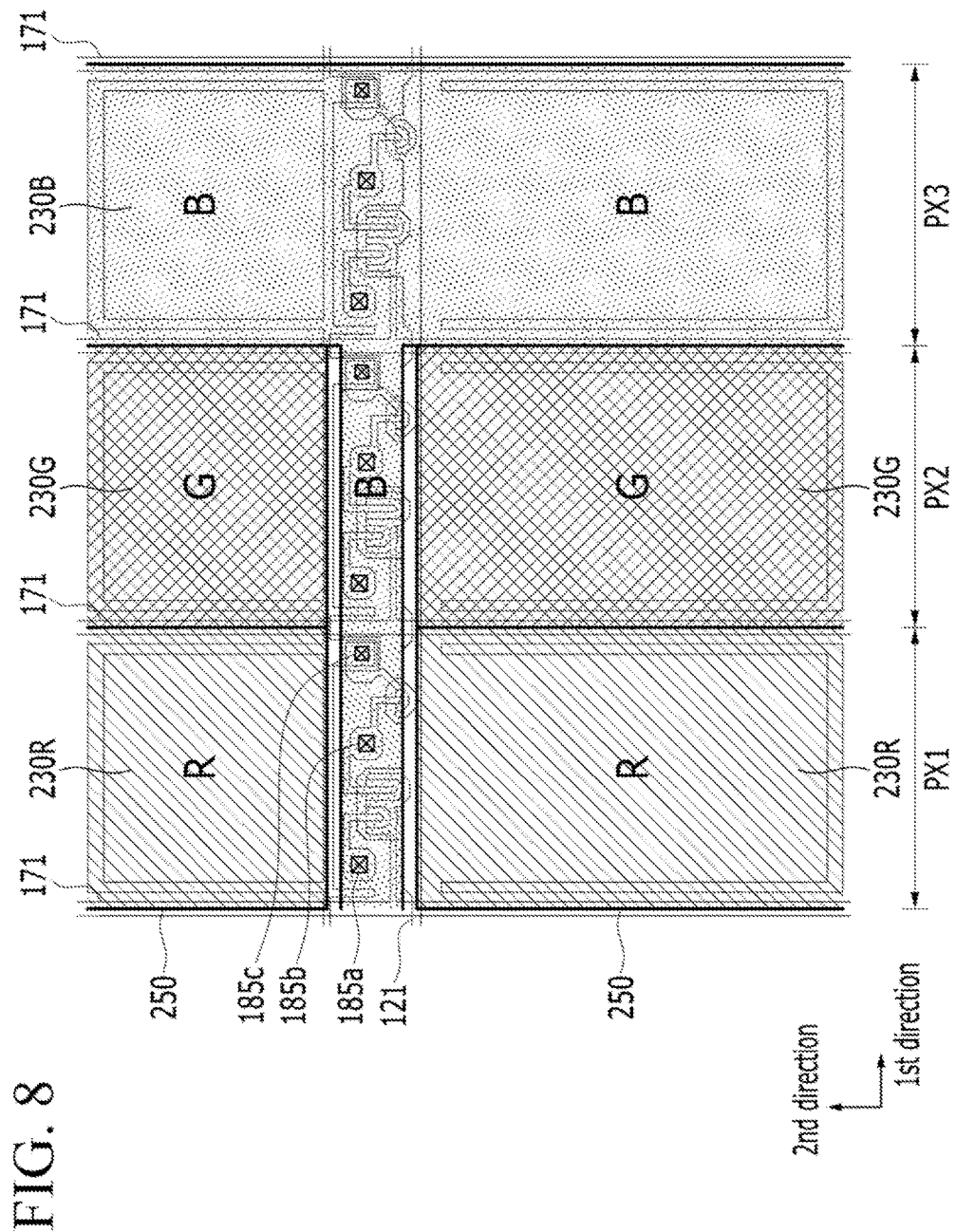
FIG. 8 is a top plan view showing a laminated state for color filters 230R, 230G, and 230B in three adjacent pixel areas PX1, PX2, and PX3 in a liquid crystal display according to the exemplary embodiment of FIG. 6.

FIG. 6 is a schematic layout for a first pixel area PX1 in a liquid crystal display according to an exemplary embodiment of the present inventive concept, and FIG. 7 is a cross-sectional view of the liquid crystal display of FIG. 6 taken along line FIG. 8 is a top plan view showing a laminated state of color filters 230R, 230G, and 230B in three adjacent pixel areas PX1, PX2, and PX3 in a liquid crystal display according to the exemplary embodiment of FIG. 6.

Referring to FIG. 6 to FIG. 8, the gate conductor including the storage electrode line 131, the storage electrodes 135, 136, 138, and 139, and the gate line 121 are formed on the first substrate 110 of the thin film transistor array panel 100, and the gate insulating layer 140, the first to third thin film transistor, and the first passivation layer 180p are sequentially formed.

The color filters 230R, 230G, and 230B are formed on the first passivation layer 180 *p*. The red color filter 230R is formed in the first pixel area PX1, the green color filter 230G is formed in the second pixel area PX2, and the blue color filter 230B is formed in the third pixel area PX3. The red color filter 230R and the green color filter 230G are divided into two regions by the first to third thin film transistors and the gate line 121 between the first pixel electrode 191 *a* and the second pixel electrode 191 *b*, and the blue color filter 230B is formed in the third pixel area which extends along the first line and in an area which extends along the second line crossing vertically to the first line and covering all of the first to third thin film transistors of the first to third pixel areas PX1, PX2, and PX3, the first to third contact holes 185 *a*, 185 *b*, and 185 *c*, and the gate line 121. The first line and the second line are vertically crossed to form the opening 250, and the first pixel area and the second pixel area are disposed in the opening 250. Also, the red color filter is formed in the first pixel area disposed at the opening 250, and the green color filter is formed in the second pixel area.

Accordingly, the difference between the exemplary embodiment of the FIG. 4 and the above exemplary embodiment is that the second line is spaced apart from the red color filter 230R and the green color filter 230G. The second line does not overlap the red color filter 230R and the green color filter 230G such that the step generated due to the overlapping of the color filter may be prevented. Accordingly, by avoiding the step, the design limitation in which the contact hole, the spacer, etc., is formed may be solved.

Also, the interval between the red color filter 230R and the green color filter 230G and the second line may overlap the storage electrode line 131 or the gate line 121. By forming the above interval on the storage electrode line 131 or the gate line 121, light leakage through the above interval may be prevented by the storage electrode line 131 or the gate line 121.

The second passivation layer 180q and the pixel electrode 191 are formed on the color filters 230R, 230G, and 230B, and an opaque material 197 is deposited on the second passivation layer 180q and the pixel electrode 191.

The opaque material 197 is formed to extend in the same direction as the gate line 121 in order to overlap at least portion of two data lines 171 disposed at both sides of one pixel area. The opaque material 197 is formed to cover all of the first to third thin film transistors of the first to third pixel areas PX1, PX2, and PX3, the first to third contact holes 185a, 185b, and 185c, the gate line 121, and the interval between the second line and the red color filter 230R, and the green color filter 230G. The opaque material 197 may have a function of preventing light leakage.

The light blocking member 220 and the first alignment layer 11 are sequentially formed on the pixel electrode 191 and the opaque material 197, and the opposing display panel 200 in which the common electrode 270 and the second alignment layer 21 are formed on the second substrate 210 is disposed to face thereto, and the liquid crystal layer 3 is formed therebetween. The liquid crystal molecule 31 is injected in the space between thin film transistor array panel 100 and the opposing display panel 200 to form the liquid crystal layer 3.

Next, another exemplary embodiment of the present inventive concept will be described with reference to FIG. 9 and FIG. 10 while focusing on the differences from the exemplary embodiment shown in FIG. 1 to FIG. 5. The shapes and the structure of the other constituent elements are the same as in the descriptions of FIG. 1 to FIG. 5, thus the duplicate description thereof is omitted.

Figure 9:
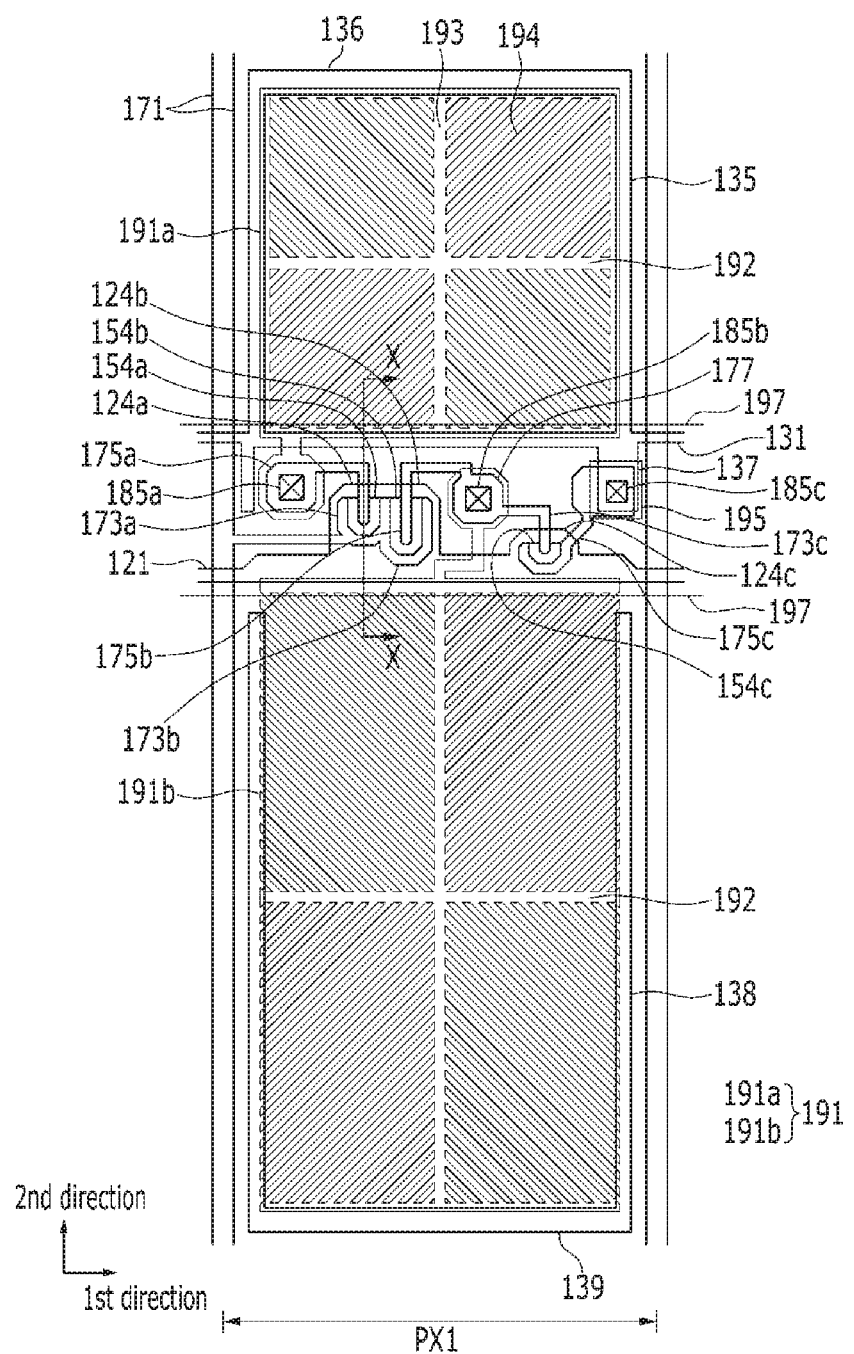
FIG. 9 is a schematic layout view of a first pixel area PX1 in a liquid crystal display according to an exemplary embodiment of the present inventive concept.
Figure 10:
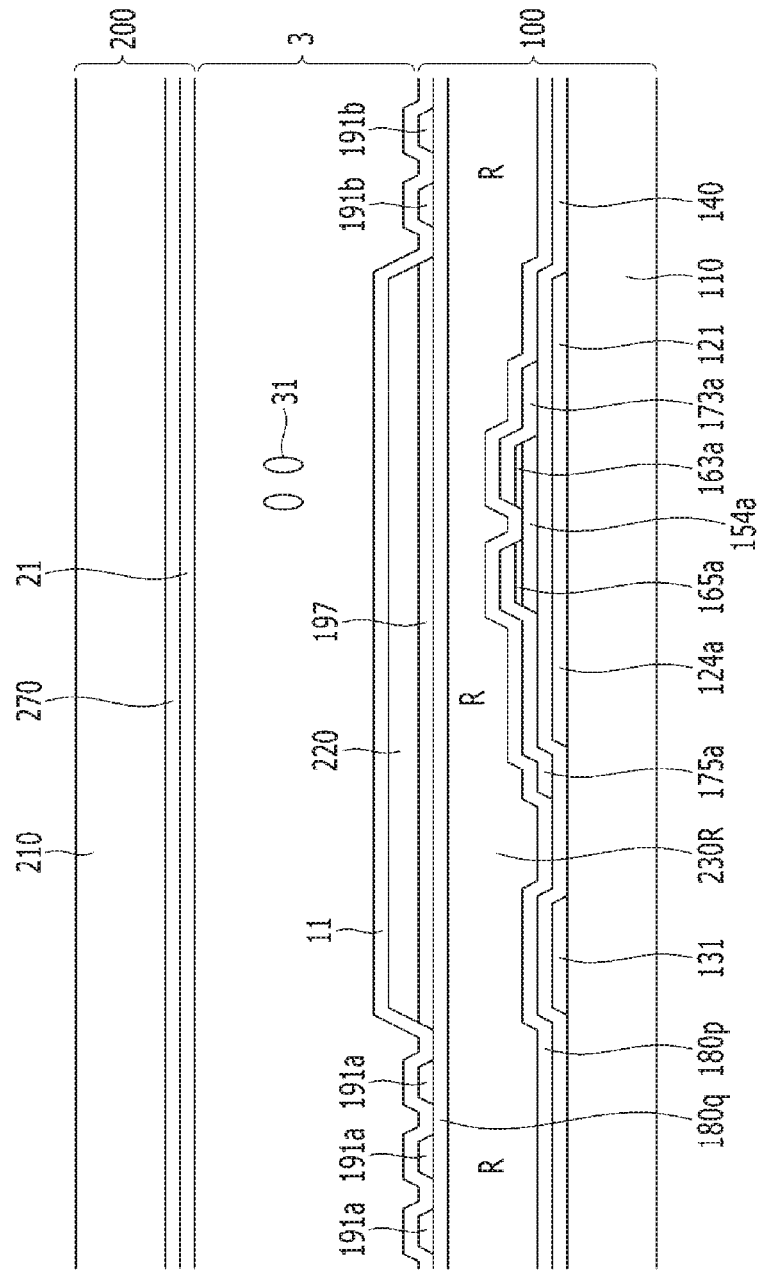
FIG. 10 is a cross-sectional view of the liquid crystal display of FIG. 9 taken along line X-X.

FIG. 9 is a schematic layout view of a first pixel area PX1 in a liquid crystal display according to an exemplary embodiment of the present inventive concept, and FIG. 10 is a cross-sectional view of the liquid crystal display of FIG. 9 taken along line X-X.

Referring to FIG. 9 and FIG. 10, the gate conductor including the storage electrode line 131, the storage electrodes 135, 136, 138, and 139, and the gate line 121 is formed on the first substrate 110 of the thin film transistor array panel 100, and the gate insulating layer 140, the first to third thin film transistors, and the first passivation layer 180p are sequentially formed thereon.

On the first passivation layer 180p, the red color filter 230R is formed on the first pixel area PX1. Accordingly, the difference from the exemplary embodiment shown in FIG. 1 to FIG. 5 is that the red color filter 230R is not divided in the first pixel area PX1, but is formed on the region where the first to third thin film transistors between the first pixel electrode 191a and the second pixel electrode 191b are formed. That is, the red color filter 230R is formed in the entire first pixel area PX1 including the upper portion of the first to third thin film transistors of the first pixel area PX1, the first to third contact holes 185a, 185b, and 185c, and the gate line 121.

Although not shown, the color filter is formed in a pixel area without the separation in each pixel area on the second and third pixel areas like the first pixel area PX1. The green color filter 230G is formed in the entire second pixel area PX2 and the blue color filter 230B is formed in the entire third pixel area PX3. Unlike the exemplary embodiment shown in FIG. 1 to FIG. 5, the blue color filter 230B is only formed in the third pixel area PX3 and is not formed in the first pixel area PX1 and the second pixel area PX2.

The second passivation layer 180q and the pixel electrode 191 are formed on the color filters 230R, 230G, and 230B, and the opaque material 197 is formed on the second passivation layer 180q and the pixel electrode 191. The opaque material 197 extends in the same direction as the gate line 121 in order to overlap at least portion of two data lines 171 disposed at both sides of one pixel area. The opaque material 197 is formed to cover all of the first to third thin film transistors of the first to third pixel areas PX1, PX2, and PX3, the first to third contact holes 185a, 185b, and 185c, and the gate line 121. The opaque material 197 may have the function of preventing light leakage.

The light blocking member 220 and the first alignment layer 11 are sequentially formed on the pixel electrode 191 and the opaque material 197, and in the opposing display panel 200 facing thereto, the common electrode 270 and the second alignment layer 21 are formed on the second substrate 210, and the liquid crystal layer 3 is formed therebetween. The liquid crystal layer 3 includes the liquid crystal molecules 31.

Next, another exemplary embodiment of the present inventive concept will be described with reference to FIG. 11 and FIG. 12 while focusing on the differences from the exemplary embodiment shown in FIG. 1 to FIG. 5. The shapes and the deposition structure of the other constituent elements are the same as the descriptions referred to in FIG. 1 to FIG. 5, and thus a duplicate description thereof is omitted.

Figure 11:
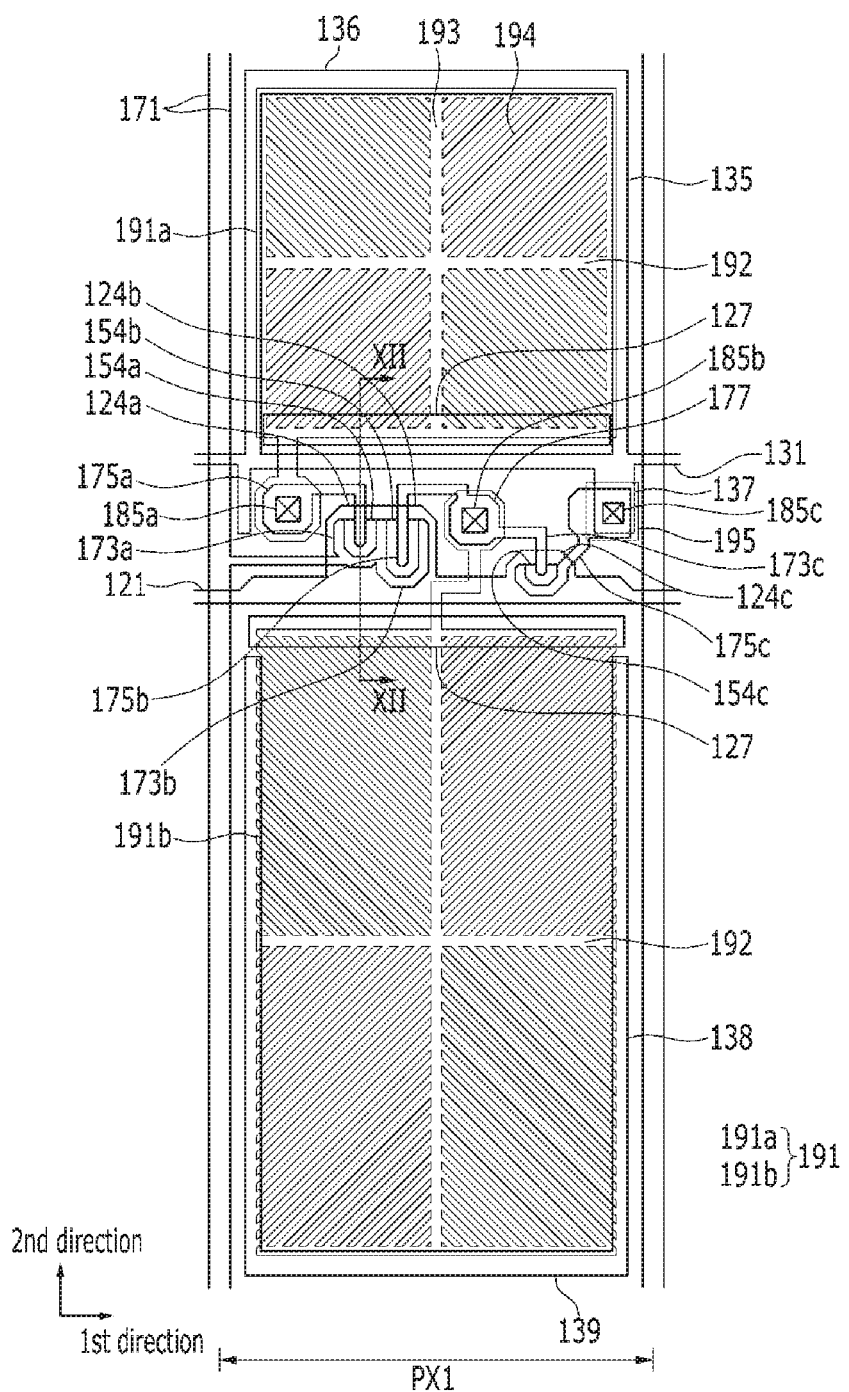
FIG. 11 is a schematic layout view of a first pixel area PX1 in a liquid crystal display according to an exemplary embodiment of the present inventive concept.
Figure 12:
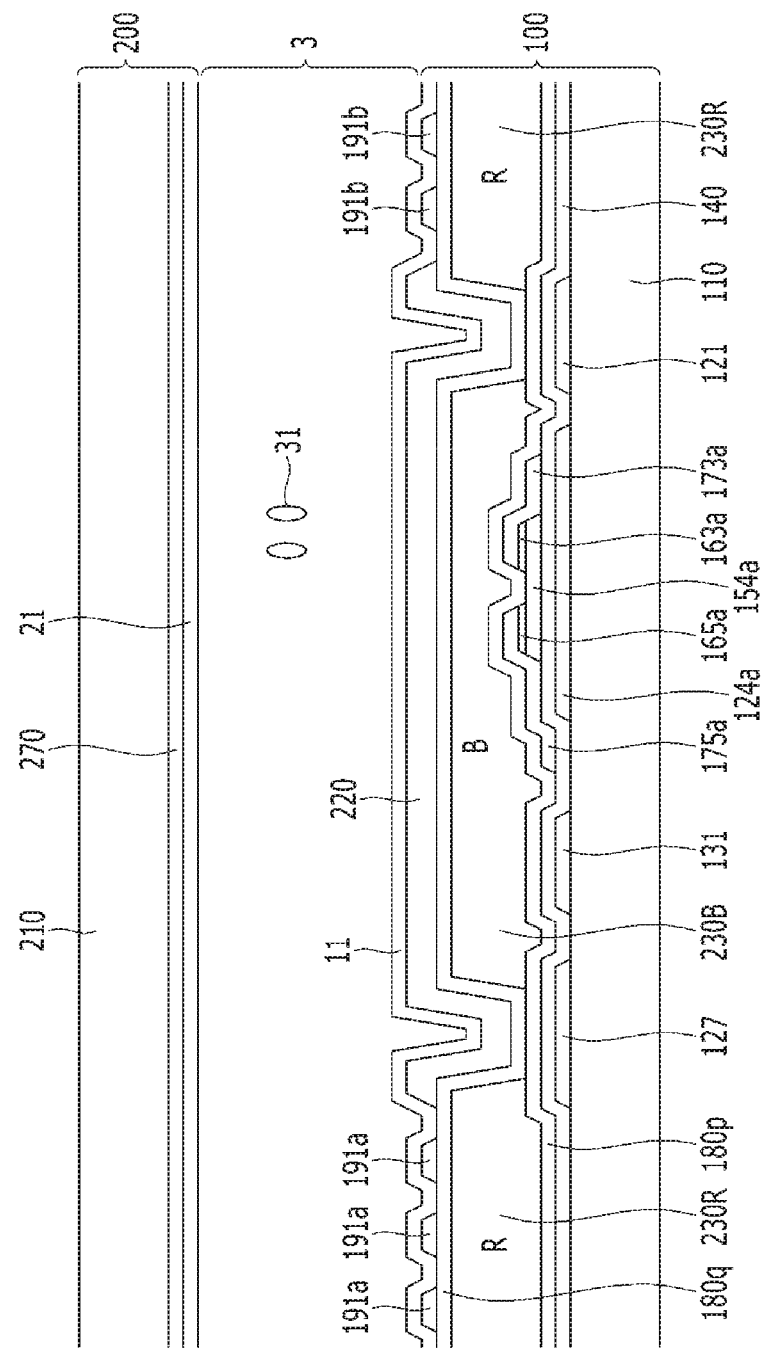
FIG. 12 is a cross-sectional view of the liquid crystal display of FIG. 11 taken along line XII-XII.

FIG. 11 is a schematic layout view of a first pixel area PX1 in a liquid crystal display according to an exemplary embodiment of the present inventive concept, and FIG. 12 is a cross-sectional view of the liquid crystal display of FIG. 11 taken along line XII-XII.

Referring to FIG. 11 and FIG. 12, the gate conductor including the storage electrode line 131, the storage electrodes 135, 136, 138, 139, and the gate line 121 is formed on the first substrate 110 of the thin film transistor array panel 100.

A light leakage preventing layer 127 made of the same material as the gate conductor is formed in the same layer as the gate conductor. The light leakage preventing layer 127 is not connected to the gate conductor and is independently positioned. The light leakage preventing layer 127 is positioned below the interval between the color filters, which will be described later, thereby preventing light leakage.

The gate insulating layer 140, the first to third thin film transistors, and the first passivation layer 180p are sequentially formed on the gate conductor.

The color filters 230R, 230G, and 230B are formed on the first passivation layer 180p. The red color filter 230R is formed in the first pixel area PX1, although not shown, like the exemplary embodiment shown in FIG. 1 to FIG. 5, the green color filter 230G is formed in the second pixel area PX2, and the blue color filter 230B is formed in the third pixel area PX3. The red color filter 230R and the green color filter 230G are divided into two regions by the first to third thin film transistors and the gate line 121 between the first pixel electrode 191a and the second pixel electrode 191b, and the blue color filter 230B is formed in the third pixel area PX3 which extends along the first line and in an area which extend along a second line substantially perpendicular to the first line in which the first to third thin film transistors of the first to third pixel areas PX1, PX2, and PX3, the first to third contact holes 185a, 185b, and 185c, and the gate line 121 are formed.

Accordingly, the difference from the exemplary embodiment shown in FIG. 1 to FIG. 5 is that the second line is spaced apart from the red color filter 230R and the green color filter 230G by a predetermined interval, and the interval is formed on the light leakage preventing layer 127. The second line does not overlap the red color filter 230R and the green color filter 230G such that the step due to the overlapping of the color filters may be prevented, thereby avoiding the step in which the contact hole, the spacer, etc., must be disposed, and thus the design limitation may be solved. Also, by forming the interval on the light leakage preventing layer 127, the light may be prevented from being leaked through the interval.

The second passivation layer 180q and the pixel electrode 191 are formed on the color filters 230R, 230G, and 230B, and the light blocking member 220 and the first alignment layer 11 are sequentially formed on the pixel electrode 191 and the opaque material 197.

The thin film transistor array panel 100 faces the opposing display panel 200 in which the common electrode 270 and the second alignment layer 21 are formed on the second substrate 210, and the liquid crystal layer 3 is formed therebetween. The liquid crystal layer 3 includes the liquid crystal molecules 31.

The present inventive concept is described through preferable exemplary embodiments described above, however the scope of the present inventive concept is not limited thereto and various exemplary embodiments may be provided. In the described exemplary embodiments, each of the color filters 230R, 230G, and 230B displays one among three primary colors of red, green, and blue, however it is not limited to three primary colors of red, green, and blue, and one of cyan, magenta, yellow, and white-based colors may be displayed. In addition, the color filter formed of the first line and the second line may be of other colors such as the red color filter 230R and the green color filter 230G, not the blue color filter 230B.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A liquid crystal display comprising:
a first substrate including a plurality of thin film transistors, a blue color filter, a plurality of red color filters, a plurality of green color filters and a plurality of gate lines extending in a first direction;
a second substrate facing the first substrate; and
a liquid crystal layer formed between the first substrate and the second substrate,
wherein the blue color filter includes a plurality of first portions extending in the first direction, and a plurality of second portions extending in a second direction substantially perpendicular to the first direction and connected to the plurality of first portions in order to form a plurality of openings,
wherein one of the plurality of red color filters and one of the plurality of green color filters are disposed in one opening of the plurality of openings,
wherein each of the plurality of openings has two different color filters therein,
wherein the plurality of first portions overlap the plurality of thin film transistors, and
wherein a region of the plurality of first portions overlapping the plurality of thin film transistors does not overlap any of the plurality of red color filters and the plurality of green color filters.

2. The liquid crystal display of claim 1, wherein the plurality of first portions do not overlap the plurality of red color filters and the plurality of green color filters in the second direction in a plan view.

3. The liquid crystal display of claim 2, further comprising an opaque material overlapping spaces formed between the plurality of first portions and the plurality of red color filters and spaces between the plurality of first portions and the plurality of green color filters.

4. The liquid crystal display of claim 1, wherein the plurality of second portions of the blue color filter is not disposed between the plurality of red color filters and the plurality of green color filters.

5. A liquid crystal display comprising:
a first substrate including a blue color filter, a plurality of red color filters, and a plurality of green color filters;
a second substrate facing the first substrate;
a liquid crystal layer formed between the first substrate and the second substrate;
a plurality of thin film transistors formed on the first substrate; and
an opaque material formed on the plurality of thin film transistors to overlap the plurality of thin film transistors,
wherein the blue color filter includes a plurality of first portions extending in a first direction, and a plurality of second portions extending in a second direction substantially perpendicular to the first direction and connected to the plurality of first portions in order to form a plurality of openings,
wherein one of the plurality of red filters and one of the plurality of green color filters are disposed in one opening of the plurality of openings,
wherein each of the plurality of openings has two different color filters therein,
wherein the plurality of first portions overlap the plurality of thin film transistors, and
wherein a region of the plurality of first portions overlapping the plurality of thin film transistors does not overlap any of the plurality of red color filters and the plurality of green color filters.

6. The liquid crystal display of claim 5, wherein the opaque material is formed of aluminum (Al) or copper (Cu).

7. The liquid crystal display of claim 6, wherein the plurality of first portions do not overlap the plurality of red color filters and the plurality of green color filters in the second direction in a plan view.

8. The liquid crystal display of claim 7, wherein the opaque material overlaps spaces formed between the plurality of first portions and the plurality of red color filters, and spaces formed between the plurality of first portions and the plurality of green color filters.

9. The liquid crystal display of claim 5, wherein the plurality of second portions of the blue color filter is not disposed between the plurality of red color filters and the plurality of green color filters.

* * * * *